United States Patent
Wang

(10) Patent No.: US 11,864,427 B2
(45) Date of Patent: Jan. 2, 2024

(54) DISPLAY PANEL WITH GROOVE IN PIXEL DEFINING LAYER AND MANUFACTURING METHOD THEREOF

(71) Applicant: Wuhan China Star Optoelectronics Semiconductor Display Technology Co., Ltd., Hubei (CN)

(72) Inventor: Lei Wang, Wuhan (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 781 days.

(21) Appl. No.: 16/963,008

(22) PCT Filed: May 26, 2020

(86) PCT No.: PCT/CN2020/092331
§ 371 (c)(1),
(2) Date: Jul. 17, 2020

(87) PCT Pub. No.: WO2021/196377
PCT Pub. Date: Oct. 7, 2021

(65) Prior Publication Data
US 2022/0392976 A1    Dec. 8, 2022

(30) Foreign Application Priority Data

Apr. 3, 2020  (CN) .......................... 202010261085.4

(51) Int. Cl.
*H10K 59/122* (2023.01)
*H10K 50/86* (2023.01)
*H10K 71/00* (2023.01)
*H10K 59/38* (2023.01)
*H10K 59/12* (2023.01)

(52) U.S. Cl.
CPC ......... *H10K 59/122* (2023.02); *H10K 50/865* (2023.02); *H10K 71/00* (2023.02); *H10K 59/1201* (2023.02); *H10K 59/38* (2023.02)

(58) Field of Classification Search
CPC .... H10K 59/122; H10K 50/865; H10K 71/00; H10K 59/38
See application file for complete search history.

(56) References Cited

U.S. PATENT DOCUMENTS

| | | |
|---|---|---|
| 2018/0240822 A1* | 8/2018 | Lee .................... H01L 27/1255 |
| 2019/0251318 A1* | 8/2019 | Jung ................... H10K 50/8445 |
| 2021/0384475 A1* | 12/2021 | Wang ................... H10K 59/122 |

* cited by examiner

*Primary Examiner* — Nduka E Ojeh
(74) *Attorney, Agent, or Firm* — PV IP PC; Wei Te Chung; Zhigang Ma

(57) ABSTRACT

The present application provides a display panel and a manufacturing method thereof. The display panel includes a pixel defining layer, a light-emitting layer, an encapsulation layer, and a color filter functional layer. The pixel defining layer is provided with a first surface and a second surface opposite to each other, and a groove. The light-emitting layer is disposed in the groove. The encapsulation layer is disposed on the first surface of the pixel defining layer and extends to cover the light-emitting layer. The color filter functional layer is disposed in the encapsulation layer and corresponds to the groove.

16 Claims, 2 Drawing Sheets

DISPLAY PANEL WITH GROOVE IN PIXEL DEFINING LAYER AND MANUFACTURING METHOD THEREOF

FIELD OF APPLICATION

The present application is related to the field of manufacturing technology of display panels, and specifically, to a display panel and a manufacturing method thereof.

BACKGROUND OF APPLICATION

A polarizer (POL) can effectively reduce reflectivity of a panel under strong light but can lose up to nearly 58% of light extraction, and for an organic light-emitting diode (OLED) display panel, this greatly increases a burden on its lifespan. In another aspect, the polarizer is thick and brittle, which is not conducive to a dynamic bending display panel.

Therefore, providing a display panel capable of realizing dynamic bending has become a technical problem to be urgently solved by those skilled in the art.

SUMMARY OF APPLICATION

The present application provide a display panel and a manufacturing method thereof to solve problems that the display panel cannot be bent dynamically.

The present application provides a display panel including:
- a pixel defining layer provided with a first surface and a second surface opposite to each other, and a groove;
- a light-emitting layer disposed in the groove;
- an encapsulation layer disposed on the first surface of the pixel defining layer and extending to cover the light-emitting layer; and
- a color filter functional layer disposed in the encapsulation layer and corresponding to the groove.

In an embodiment, the encapsulation layer includes a first sub-encapsulation layer, a second sub-encapsulation layer, and a third sub-encapsulation layer. The first sub-encapsulation layer is disposed on the first surface of the pixel defining layer and extends to cover the light-emitting layer. The second sub-encapsulation layer covers surfaces of the first sub-encapsulation layer and the color filter functional layer away from the pixel defining layer. The third sub-encapsulation layer is disposed on a surface of the second sub-encapsulation layer away from the first sub-encapsulation layer.

In an embodiment, the color filter functional layer is disposed between the first sub-encapsulation layer and the second sub-encapsulation layer and is located in the groove.

In an embodiment, a top of the color filter functional layer is curved and is lower than a plane of the second sub-encapsulation layer.

In an embodiment, the color filter functional layer is formed on the first sub-encapsulation layer by inkjet printing.

In an embodiment, the display panel further includes an anode layer, a cathode layer, and a light-shielding layer. The light-shielding layer is disposed on the first surface of the pixel defining layer and is located on two sides of the groove. The cathode layer is disposed between the light-shielding layer and the first sub-encapsulation layer. The light-emitting layer disposed in the groove is disposed between the first sub-encapsulation layer and the light-emitting layer. The anode layer is disposed on a surface of the light-emitting layer away from the cathode layer.

In an embodiment, the display panel further includes a planarization layer, an interlayer insulating layer, a first insulating layer, and a second insulating layer. The planarization layer is disposed on the second surface. The second insulating layer is disposed on a surface of the planarization layer away from the pixel defining layer. The first insulating layer is disposed on a surface of the second insulating layer away from the planarization layer.

In an embodiment, the display panel further includes a thin-film transistor. The thin-film transistor includes a first port and a second port. The planarization layer, the interlayer insulating layer, the first insulating layer, and the second insulating layer are provided with a channel, and the first port is connected to the anode layer and communicates with the second port by the channel.

In an embodiment, the display panel further includes a buffer layer and an insulating thin-film layer. The buffer layer is disposed on a surface of the first insulating layer away from the second insulating layer, and the insulating thin-film layer is disposed on a surface of the buffer layer away from the first surface of the first insulating layer.

In an embodiment, the color filter functional layer includes a red color resist, a green color resist, a blue color resist, and a black matrix. The red color resist, the green color resist, and the blue color resist respectively correspond to a red subpixel unit, a green subpixel unit, and a blue subpixel unit.

The present application further provides a manufacturing method od the display panel including:
- providing a pixel defining layer with a first surface and a second surface opposite to each other, and a groove;
- disposing a light-emitting layer in the groove;
- disposing a color filter functional layer in an encapsulation layer, wherein the color filter functional layer corresponds to the groove; and
- disposing the color filter functional layer and the encapsulation layer on the first surface of the pixel defining layer, wherein the encapsulation layer extends to cover the light-emitting layer.

In an embodiment, the color filter functional layer is disposed between the first sub-encapsulation layer and the second sub-encapsulation layer and is located in the groove.

In an embodiment, a top of the color filter functional layer is curved and is lower than a plane of the second sub-encapsulation layer.

In an embodiment, the color filter functional layer is formed on the first sub-encapsulation layer by inkjet printing.

In an embodiment, the display panel further includes an anode layer, a cathode layer, and a light-shielding layer. The light-shielding layer is disposed on the first surface of the pixel defining layer and is located on two sides of the groove. The cathode layer is disposed between the light-shielding layer and the first sub-encapsulation layer. The light-emitting layer disposed in the groove is disposed between the first sub-encapsulation layer and the light-emitting layer. The anode layer is disposed on a surface of the light-emitting layer away from the cathode layer.

In an embodiment, the display panel further includes a planarization layer, an interlayer insulating layer, a first insulating layer, and a second insulating layer. The planarization layer is disposed on the second surface. The second insulating layer is disposed on a surface of the planarization layer away from the pixel defining layer. The first insulating layer is disposed on a surface of the second insulating layer away from the planarization layer.

In an embodiment, the display panel further includes a thin-film transistor. The thin-film transistor includes a first port and a second port. The planarization layer, the interlayer insulating layer, the first insulating layer, and the second insulating layer are provided with a channel, and the first port is connected to the anode layer and communicates with the second port by the channel.

In an embodiment, the display panel further includes a buffer layer and an insulating thin-film layer. The buffer layer is disposed on a surface of the first insulating layer away from the second insulating layer, and the insulating thin-film layer is disposed on a surface of the buffer layer away from the first surface of the first insulating layer.

In an embodiment, the color filter functional layer includes a red color resist, a green color resist, a blue color resist, and a black matrix. The red color resist, the green color resist, and the blue color resist respectively correspond to a red subpixel unit, a green subpixel unit, and a blue subpixel unit.

The display panel provided by the present application includes the pixel defining layer, the light-emitting layer, the encapsulation layer, and the color filter functional layer. The pixel defining layer is provided with the first surface and the second surface opposite to each other, and the groove. The light-emitting layer is disposed in the groove. The encapsulation layer is disposed on the first surface of the pixel defining layer and extends to cover the light-emitting layer. The color filter functional layer is disposed in the encapsulation layer and corresponds to the groove. Because the color filter functional layer is disposed in the encapsulation layer and corresponds to the light-emitting layer in the groove, a thickness of the display panel can be reduced by replacing a polarizer with the color filter functional layer, which facilitates bending of the display panel. Meanwhile, because the color filter functional layer is disposed in the encapsulation layer, the color filter functional layer can be disposed closer to the light-emitting layer. This can further reduce the thickness of the display panel and is beneficial to increasing performance of light extraction of the display panel.

DESCRIPTION OF DRAWINGS

In order to describe technical solutions in the present application clearly, drawings to be used in the description of embodiments will be described briefly below.

DETAILED DESCRIPTION OF PREFERRED EMBODIMENTS

Figure 1:
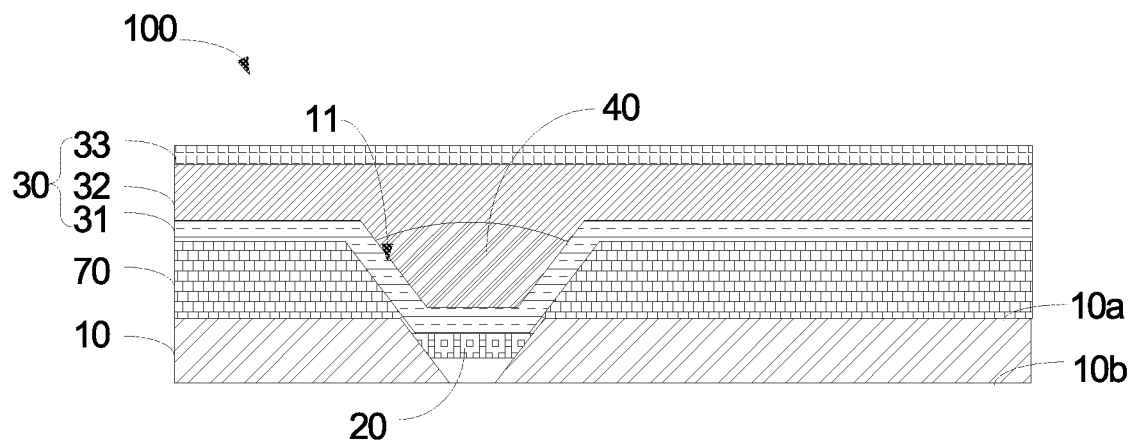
FIG. 1 is a structural schematic diagram of a display panel provided by an embodiment of the present application.

To further explain the technical means and effects of the present application, the following refers to embodiments and drawings for detailed description. Obviously, the described embodiments are only for some embodiments of the present application, instead of all embodiments. Based on the embodiments of the present application, all other embodiments obtained by those skilled in the art without creative work fall into a protection scope of the present application.

In the drawings, components with same structure are denoted by same numerals, and components with similar structures or functions are denoted by similar numerals. In the description of the present application, it is to be understood that the terms "up," "down," "front," "back," "left," "right," "inside," "outside," and the like, indicate orientations or positional relationships, and are based on the orientations or positional relationships shown in the drawings, merely for the purpose of facilitating the description of the present application and the simplified description, rather than indicating or implying that the devices or elements have to have a specific orientation, or be constructed and operated in a particular orientation, and therefore may not be construed as limits to the present application.

The present application provides a display panel and a manufacturing method thereof. The display panel is described in detail below.

Please refer to FIG. 1, FIG. 1 is a structural diagram of the display panel 100 provided by an embodiment of the present application. The display panel 100 provided by an embodiment of the present application includes a pixel defining layer 10, a light-emitting layer 20, an encapsulation layer 30, and a color filter functional layer 40. The pixel defining layer 10 provided with a first surface 10a and a second surface 10b opposite to each other, and a groove 11. The light-emitting layer 20 is disposed in the groove 11. The encapsulation layer 30 is disposed on the first surface 10a of the pixel defining layer 10 and extends to cover the light-emitting layer 20. The color filter functional layer 40 is disposed in the encapsulation layer 30 and corresponds to the groove 11.

It should be explained that the first surface 10a can be an upper surface of the pixel defining layer 10 and the second surface 10b can be a lower surface of the pixel defining layer 10. Of course, the first surface 10a can also be the lower surface of the pixel defining layer 10, and the second surface 10b can be the upper surface of the pixel defining layer 10. In cases of embodiments of the preset application with no special description, by default the first surface 10a is the upper surface of the pixel defining layer 10 and the second surface 10b is the lower surface of the pixel defining layer 10.

Using the color filter functional layer 40 to replace a polarizer (POL) by using a color filter is classified as POL-less technology, which can not only reduce a thickness of a functional layer from greater than 100 μm to less than 5 μm, but can also increase light extraction efficiency from 42% to 60%. A basic structure of the color filter includes red (R), green (G), and blue (B) color resists and a black matrix (BM). Due to OLEDs' unique property of self-luminescence, the color resists need to respectively correspond to red, green, and blue subpixel units of the OLEDs, so as to form the color filter functional layer 40.

Figure 2:
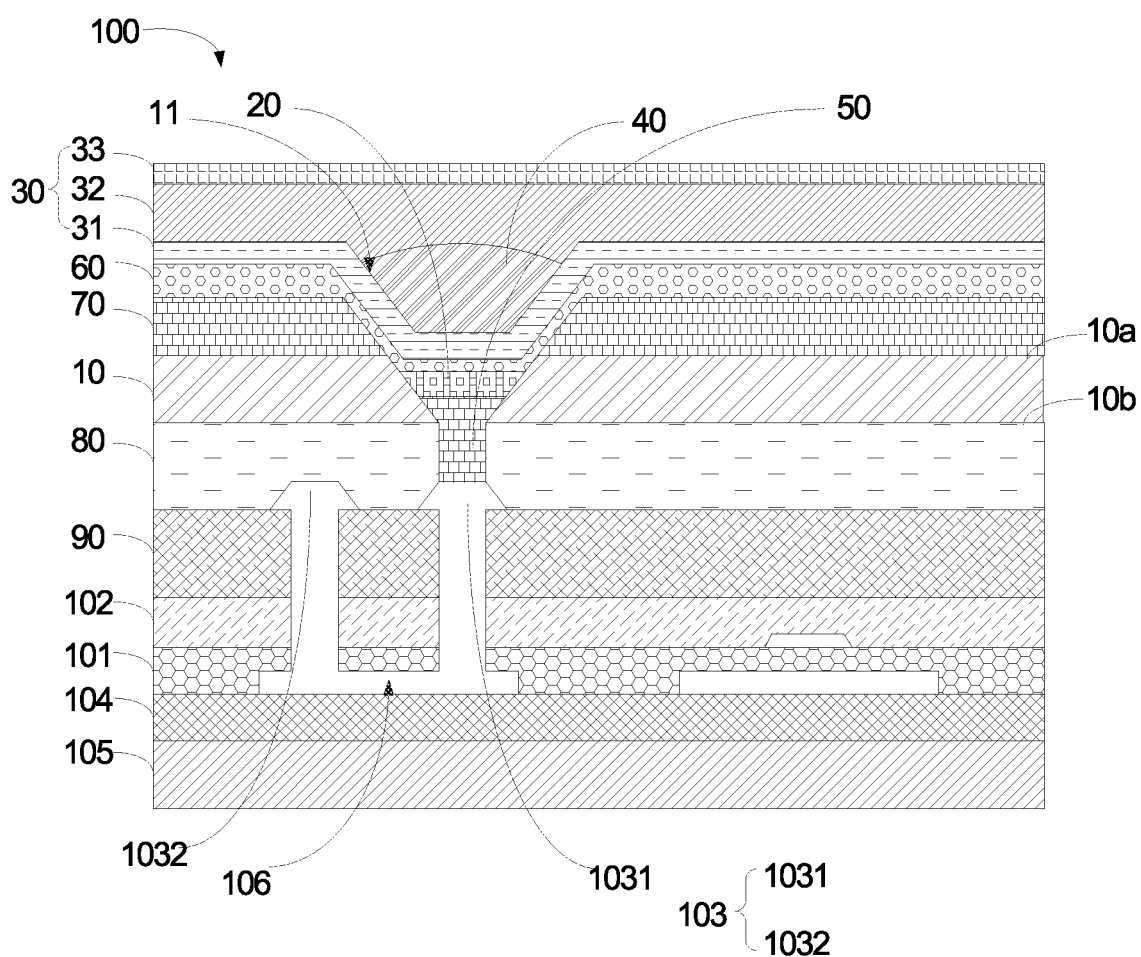
FIG. 2 is another structural schematic diagram of the display panel provided by an embodiment of the present application.

Please refer to FIG. 2, FIG. 2 is another structural diagram of the display panel 100 provided by an embodiment of the present application. The encapsulation layer 30 includes a first sub-encapsulation layer 31, a second sub-encapsulation layer 32, and a third sub-encapsulation layer 33. The first sub-encapsulation layer 31 is disposed on the first surface 10a of the pixel defining layer 10 and extends to cover the light-emitting layer 20. The second sub-encapsulation layer 32 covers surfaces of the first sub-encapsulation layer 31 and the color filter functional layer 40 away from the pixel defining layer 10. The third sub-encapsulation layer 33 is disposed on a surface of the second sub-encapsulation layer 32 away from the first sub-encapsulation layer 31.

It should be explained that the first sub-encapsulation layer 31 can be an organic layer and the first sub-encapsulation layer 31 is patterned. The second sub-encapsulation layer 32 is formed on a surface of the first sub-encapsulation layer 31 away from the pixel defining layer 10 by inkjet printing. The third sub-encapsulation layer 33 can be an inorganic layer. The third sub-encapsulation layer 33 can also be formed on the surface of the second sub-encapsulation layer 32 away from the first sub-encapsulation layer 31 by inkjet printing. Specifically, materials of the first sub-encapsulation layer 31 and the third sub-encapsulation layer 33 can be SiNx or SiOx.

The color filter functional layer 40 is disposed between the first sub-encapsulation layer 31 and the second sub-encapsulation layer 32 and is located in the groove 11.

Disposing the color filter functional layer 40 between the first sub-encapsulation layer 31 and the second sub-encapsulation layer 32 and locating the color filter functional layer 40 in the groove 11 can further shorten a distance between the color filter functional layer 40 and the light-emitting layer 20. Because the distance between the color filter functional layer 40 and the light-emitting layer 20 has been shortened, it is beneficial to light extraction of the light-emitting layer 20 through the color filter functional layer 40, thereby increasing performance of light extraction of the display panel 100.

Of course, the color filter functional layer 40 can be disposed on an inner side of the second sub-encapsulation layer 32 or be disposed between the second sub-encapsulation layer 32 and the third sub-encapsulation layer 33. Compared with the prior art, the two methods above can also shorten the distance between the color filter functional layer 40 and the light-emitting layer 20, which is beneficial to increasing the performance of light extraction of the display panel 100. Meanwhile, because the color filter functional layer 40 does not need to be disposed in the groove 11, manufacturing processes are simpler, and manufacturing costs are lower.

A top of the color filter functional layer 40 is curved and is lower than a plane of the second sub-encapsulation layer 32.

It should be explained that the top of the color filter functional layer 40 is curved, so that the color filter functional layer 40 can increase light extraction angles. The top of the color filter functional layer 40 is lower than the plane of the second sub-encapsulation layer 32, so as to ensure that the color filter functional layer 40 can be spaced from the light-emitting layer 20 with a sufficiently short distance to ensure a light extraction effect of the display panel 100. Of course, in some embodiments, the top of the color filter functional layer 40 can be higher than the plane of the second sub-encapsulation layer 32, and extends to the second sub-encapsulation layer 32 or the third sub-encapsulation layer 33.

The color filter functional layer 40 is formed on the first sub-encapsulation layer 31 by inkjet printing.

It should be explained that using the inkjet printing to print the color filter functional layer 40 to the first sub-encapsulation layer 31 is more convenient.

The display panel 100 further includes an anode layer 50, a cathode layer 60, and a light-shielding layer 70. The light-shielding layer 70 is disposed on the first surface 10a of the pixel defining layer 10 and is located on two sides of the groove 11. The cathode layer 60 is disposed between the light-shielding layer 70 and the first sub-encapsulation layer 31. The light-emitting layer 20 disposed in the groove 11 is disposed between the first sub-encapsulation layer 31 and the light-emitting layer 20. The anode layer 50 is disposed on a surface of the light-emitting layer 20 away from the cathode layer 60.

The display panel 100 further includes a planarization layer 80, an interlayer insulating layer 90, a first insulating layer 101, and a second insulating layer 102. The planarization layer 80 is disposed on the second surface 10b. The second insulating layer 102 is disposed on a surface of the planarization layer 80 away from the pixel defining layer 10. The first insulating layer 101 is disposed on a surface of the second insulating layer 102 away from the planarization layer 80.

The display panel 100 further includes a thin-film transistor 103. The thin-film transistor 103 includes a first port 1031 and a second port 1032. The planarization layer 80, the interlayer insulating layer 90, the first insulating layer 101, and the second insulating layer 102 are all provided with a channel 106, and the first port 1031 is connected to the anode layer 50 and communicates with the second port 1032 by the channel 106.

The display panel 100 further includes a buffer layer 104 and an insulating thin-film layer 105. The buffer layer 104 is disposed on a surface of the first insulating layer 101 away from the second insulating layer 102, and the insulating thin-film layer 105 is disposed on a surface of the buffer layer 104 away from the first surface 10a of the first insulating layer 101.

The display panel 100 provided by the present application includes the pixel defining layer 10, the light-emitting layer 20, the encapsulation layer 30, and the color filter functional layer 40. The pixel defining layer 10 is provided with the first surface 10a and the second surface 10b opposite to each other, and the groove 11. The light-emitting layer 20 is disposed in the groove 11. The encapsulation layer 30 is disposed on the first surface 10a of the pixel defining layer 10 and extends to cover the light-emitting layer 20. The color filter functional layer 40 is disposed in the encapsulation layer 30 and corresponds to the groove 11. Because the color filter functional layer 40 is disposed in the encapsulation layer 30 and corresponds to the light-emitting layer 20 in the groove 11, a thickness of the display panel 100 can be reduced by replacing a polarizer with the color filter functional layer 40, which facilitates bending of the display panel 100. Meanwhile, because the color filter functional layer 40 is disposed in the encapsulation layer 30, the color filter functional layer 40 can be disposed closer to the light-emitting layer 20. This can further reduce the thickness of the display panel 100 and is beneficial to increasing performance of light extraction of the display panel 100.

Figure 3:
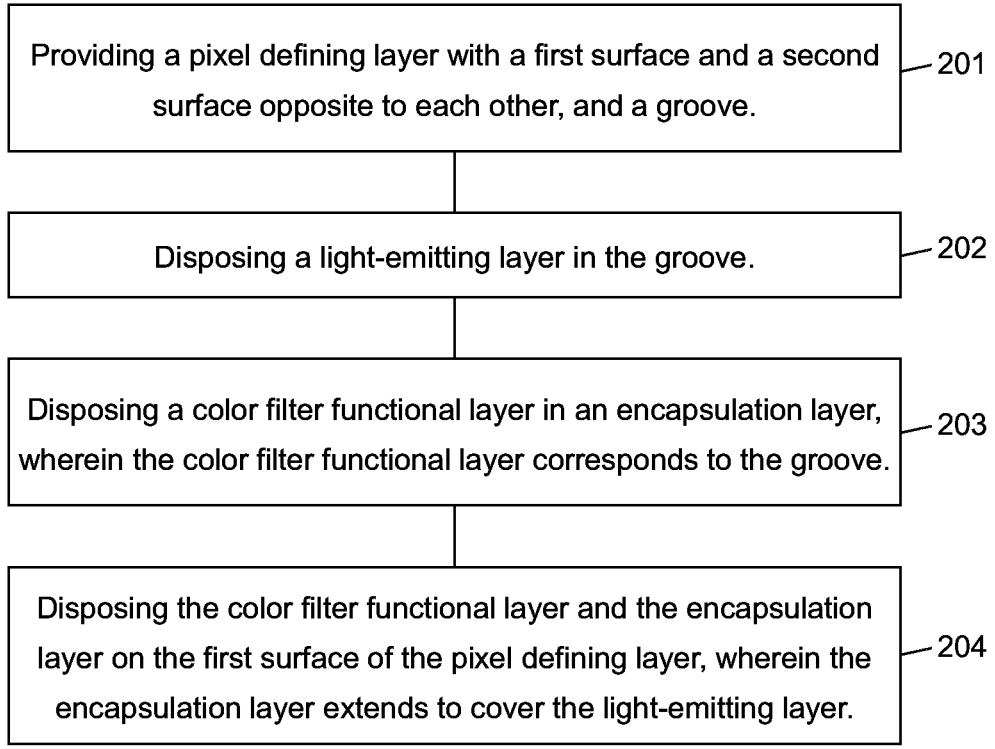
FIG. 3 is a flowchart of a manufacturing method of the display panel provided by an embodiment of the present application.

Please refer to FIG. 3, FIG. 3 is a flowchart of a manufacturing method of the display panel provided by an embodiment of the present application. An embodiment of the present application provides a manufacturing method of the display panel 100 including steps of:

201, providing a pixel defining layer with a first surface and a second surface opposite to each other, and a groove;

wherein it should be explained that the first surface can be an upper surface of the pixel defining layer and the second surface can be a lower surface of the pixel defining layer; of course, the first surface can be the lower surface of the pixel defining layer, and the second surface can be the upper surface of the pixel defining layer; and in a case of no special description in an embodiment of the preset application, the first surface is the upper surface of the pixel defining layer by default, and the second surface 10b is the lower surface of the pixel defining layer 10 by default;

202, disposing a light-emitting layer in the groove;

203, disposing a color filter functional layer in an encapsulation layer, wherein the color filter functional layer corresponds to the groove;

wherein it should be explained that using the color filter functional layer to replace a polarizer (POL) by using a color filter is classified as POL-less technology, which can not only reduce a thickness of a functional layer from greater than 100 μm to less than 5 μm, but can also increase light extraction efficiency from 42% to 60%; a basic structure of the color filter includes red (R), green (G), and blue (B) color resists and a black matrix (BM); and Due to OLEDs' unique property of self-luminescence, the color resists need to respectively correspond to red, green, and blue subpixel units of the OLEDs, so as to form the color filter functional layer; and 204, disposing the color filter functional layer and the encapsulation layer on the first surface of the pixel defining layer, wherein the encapsulation layer extends to cover the light-emitting layer.

The encapsulation layer includes a first sub-encapsulation layer, a second sub-encapsulation layer, and a third sub-encapsulation layer. The first sub-encapsulation layer is disposed on the first surface of the pixel defining layer and extends to cover the light-emitting layer. The second sub-encapsulation layer covers surfaces of the first sub-encapsulation layer and the color filter functional layer away from the pixel defining layer. The third sub-encapsulation layer is disposed on a surface of the second sub-encapsulation layer away from the first sub-encapsulation layer.

The color filter functional layer is disposed between the first sub-encapsulation layer and the second sub-encapsulation layer and is located in the groove.

Disposing the color filter functional layer between the first sub-encapsulation layer and the second sub-encapsulation layer and locating the color filter functional layer in the groove can further shorten a distance between the color filter functional layer and the light-emitting layer. Because the distance between the color filter functional layer and the light-emitting layer has been shortened, it is beneficial to light extraction of the light-emitting layer through the color filter functional layer, thereby increasing performance of light extraction of the display panel.

Of course, the color filter functional layer can be disposed on an inner side of the second sub-encapsulation layer or be disposed between the second sub-encapsulation layer and the third sub-encapsulation layer. Compared with the prior art, the two methods above can also shorten the distance between the color filter functional layer and the light-emitting layer, which is beneficial to increasing the performance of light extraction of the display panel. Meanwhile, because the color filter functional layer 40 does not need to be disposed in the groove, manufacturing processes are simpler, and manufacturing costs are lower.

The present application adopts these methods. Because the color filter functional layer is disposed in the encapsulation layer and corresponds to the light-emitting layer in the groove, a thickness of the display panel can be reduced by replacing a polarizer with the color filter functional layer, which facilitates bending of the display panel. Meanwhile, because the color filter functional layer is disposed in the encapsulation layer, the color filter functional layer can be disposed closer to the light-emitting layer. This can further reduce the thickness of the display panel and is beneficial to increasing performance of light extraction of the display panel.

The display panel and the manufacturing method thereof provided by the present application is described in detail above, the specific examples of this document are used to explain principles and embodiments of the present application, and the description of embodiments above is only for helping to understand the present disclosure. Meanwhile, those skilled in the art will be able to change the specific embodiments and the scope of the disclosure according to the idea of the present application. In the above, the content of the specification should not be construed as limiting the present application. Above all, the content of the specification should not be the limitation of the present application.

What is claimed is:

1. A display panel, comprising: a pixel defining layer provided with a first surface and a second surface opposite to each other, and a groove; a light-emitting layer disposed in the groove; an encapsulation layer disposed on the first surface of the pixel defining layer and extending to cover the light-emitting layer, and a color filler functional layer disposed in the encapsulation layer and corresponding to the groove, wherein the encapsulation layer comprises a first sub-encapsulation layer, a second sub-encapsulation layer, and a third sub-encapsulation layer; wherein the first sub-encapsulation layer is disposed on the first surface of the pixel defining layer and extends to cover the light-emitting layer, the color filter functional layer is disposed on the first sub-encapsulation layer, and a top of the color filter functional layer is curved; wherein the second sub-encapsulation layer has a greater thickness than the third sub-encapsulation layer, and the second sub-encapsulation layer comprises a bottom surface and a top surface, wherein the bottom surface has a flat portion and a concave portion, the flat portion covers the first sub-encapsulation layer, and the concave portion covers the top of the color fitter functional layer, wherein the top surface is flat, and the third sub-encapsulation layer is disposed on the second sub-encapsulation layer.

2. The display panel according to claim 1, wherein the top of the color filter functional layer is lower than the flat portion of the bottom surface of the second sub-encapsulation layer.

3. The display panel according to claim 1, wherein the color filter functional layer is formed on the first sub-encapsulation layer by inkjet printing.

4. The display panel according to claim 1, further comprising an anode layer, a cathode layer, and a light-shielding layer; wherein the light-shielding layer is disposed on the first surface of the pixel defining layer and is located on two sides of the groove, wherein the cathode layer is disposed between the light-shielding layer and the first sub-encapsulation layer, wherein the light-emitting layer disposed in the groove is disposed between the first sub-encapsulation layer and the anode layer, and wherein the anode layer is disposed on a surface of the light-emitting layer away from the cathode layer.

5. The display panel according to claim 4, further comprising a planarization layer, an interlayer insulating layer, a first insulating layer, and a second insulating layer, wherein the planarization layer is disposed on the second surface; wherein the second insulating layer is disposed on a surface of the planarization layer away from the pixel defining layer; and wherein the first insulating layer is disposed on a surface of the second insulating layer away from the planarization layer.

6. The display panel according to claim 5, further comprising a thin-film transistor, wherein the thin-film transistor comprises a first port and a second port; and wherein the planarization layer, interlayer insulating layer, the first insulating layer, and the second insulating layer are provided with a channel, and the first port is connected to the anode layer and communicates with the second port by the channel.

7. The display panel according to claim 5, further comprising a buffer layer and an insulating thin-film layer; wherein the buffer layer is disposed on a surface of the first insulating layer away from the second insulating layer, and the insulating thin-film layer is disposed on a surface of the buffer layer away from the first surface of the pixel definition layer.

8. The display panel according to claim 5, wherein the color filter functional layer comprises a red color resist, a green color resist, a blue color resist, and a black matrix; and the red color resist, the green color resist, and the blue color resist respectively correspond to a red subpixel unit, a green subpixel unit, and a blue subpixel unit.

9. A manufacturing method of a display panel, comprising: providing a pixel defining layer with a first surface and a second surface opposite to each other, and a groove; disposing a light-emitting layer in the groove, disposing a color filter functional layer in an encapsulation layer, wherein the color filter functional layer corresponds to the groove; and disposing the color filter functional layer and the encapsulation layer on the first surface of the pixel defining layer, wherein the encapsulation layer extends to cover the light-emitting layer, wherein the encapsulation layer comprises a first sub-encapsulation layer, a second sub-encapsulation layer, and a third sub-encapsulation layer, wherein the first sub-encapsulation layer is disposed on the first surface of the pixel defining layer and extends to cover the light-emitting layer, the color filter functional layer is disposed on the first sub-encapsulation layer, and a top of the color filter functional layer is curved; wherein the second sub-encapsulation layer has a greater thickness than the third sub-encapsulation layer and the second sub-encapsulation layer comprises a bottom surface and a top surface, where the bottom surface has a flat portion and a concave portion, the flat portion covers the first sub-encapsulation layer, and the concave portion covers the top of the color filter functional layer, wherein the top surface is flat, and the third sub-encapsulation layer is disposed on the second sub-encapsulation layer.

10. The manufacturing method of the display panel according to 9, wherein the top of the color filter functional layer is lower than the flat portion of the bottom surface of the second sub-encapsulation layer.

11. The manufacturing method of the display panel according to 9, wherein the color filter functional layer is formed on the first sub-encapsulation layer by inkjet printing.

12. The manufacturing method of the display panel according to 9, wherein the display panel further comprises an anode layer, a cathode layer, and a light-shielding layer, the light-shielding layer is disposed on the first surface of the pixel defining layer and is located on two sides of the groove; the cathode layer is disposed between the light-shielding layer and the first sub-encapsulation layer, the light-emitting layer disposed in the groove is disposed between the first sub-encapsulation layer and the anode layer; and the anode layer is disposed on a surface of the light-emitting layer away from the cathode layer.

13. The manufacturing method of the display panel according to 12, wherein the display panel further comprises a planarization layer, an interlayer insulating layer, a first insulating layer, and a second insulating layer, the planarization layer is disposed on the second surface; the second insulating layer is disposed on a surface of the planarization layer away from the pixel defining layer; and the first insulating layer is disposed on a surface of the second insulating layer away from the planarization layer.

14. The manufacturing method of the display panel according to 13, wherein the display panel further comprises a thin-film transistor, the thin-film transistor comprises a first port and a second port; and the planarization layer, interlayer insulating layer, the first insulating layer, and the second insulating layer are provided with a channel, and the first port is connected to the anode layer and communicates with the second port by the channel.

15. The manufacturing method of the display panel according to 13, wherein the display panel further comprises a buffer layer and an insulating thin-film layer; and the buffer layer is disposed on a surface of the first insulating layer away from the second insulating layer, and the insulating thin-film layer is disposed on a surface of the buffer layer away from the first surface of the pixel definition layer.

16. The manufacturing method of the display panel according to 13, wherein the color filter functional layer comprises a red color resist, a green color resist, a blue color resist, and a black matrix; and the red color resist, the green color resist, and the blue color resist respectively correspond to a red subpixel unit, a green subpixel unit, and a blue subpixel unit.

* * * * *